United States Patent
Huang (10) Patent No.: US 11,032,921 B2
(45) Date of Patent: Jun. 8, 2021

(54) FLEXIBLE DISPLAY DEVICE AND MOBILE TERMINAL

(71) Applicant: EverDisplay Optronics (Shanghai) Co., Ltd., Shanghai (CN)

(72) Inventor: HuanYu Huang, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 0 days.

(21) Appl. No.: 16/714,988

(22) Filed: Dec. 16, 2019

(65) Prior Publication Data

US 2020/0196459 A1 Jun. 18, 2020

(30) Foreign Application Priority Data

Dec. 17, 2018 (CN) .......................... 201811544388.6

(51) Int. Cl.
*H05K 5/00* (2006.01)
*H05K 5/02* (2006.01)

(52) U.S. Cl.
CPC ......... *H05K 5/0017* (2013.01); *H05K 5/0086* (2013.01); *H05K 5/0217* (2013.01)

(58) Field of Classification Search
CPC .. H05K 5/0017; H05K 5/0086; H05K 5/0217; G06F 1/1652
See application file for complete search history.

(56) References Cited

U.S. PATENT DOCUMENTS

| | | | |
|---|---|---|---|
| 9,844,152 B2* | 12/2017 | Heo | H05K 5/03 |
| 10,201,103 B2* | 2/2019 | Kim | H01L 51/5237 |
| 2017/0329368 A1* | 11/2017 | Rho | H04M 1/0262 |

\* cited by examiner

*Primary Examiner* — Rockshana D Chowdhury
(74) *Attorney, Agent, or Firm* — Qinghong Xu (57) ABSTRACT

A flexible display device includes a flexible display panel including a first side and a second side, wherein the first side is opposite to the second side; a roll-up mechanism including a master shaft for rolling up and unrolling the flexible display panel, wherein the first side of the flexible display panel is fixed to the master shaft; a support mechanism including a plurality of supporting members, wherein the supporting members are articulated each other; wherein the supporting members are stored under the flexible display panel, when the flexible display panel is rolled up; wherein the supporting members are leaned to a backside surface of the flexible display panel, when the flexible display panel is unrolled.

10 Claims, 9 Drawing Sheets

FLEXIBLE DISPLAY DEVICE AND MOBILE TERMINAL

CROSS REFERENCE TO RELATED APPLICATIONS

This application is based upon and claims the benefit of priority of Chinese Patent Application No. CN201811544388.6, filed on Dec. 17, 2018, the entire contents thereof are incorporated herein by reference.

TECHNICAL FIELD

The present disclosure generally relates to the field of display technology, and more particularly, to a flexible display device and a mobile terminal.

BACKGROUND

Exterior design of ordinary display panel is limited with the development requirement of display products, which prompts the development and application of flexible displays.

Flexible display products are bendable and foldable, and easy to carry. Moreover, flexible display products can be designed with various shapes, which enhances product innovation and aesthetics, and meet various user requirements.

SUMMARY

The present disclosure provides a flexible display device and a mobile terminal.

In some embodiments, there is provided a flexible display device, the flexible display device includes a flexible display panel including a first side and a second side, wherein the first side is opposite to the second side; a roll-up mechanism including a master shaft for rolling up and unrolling the flexible display panel, wherein the first side of the flexible display panel is fixed to the master shaft; a support mechanism including a plurality of supporting members, wherein the supporting members are articulated each other; wherein the supporting members are stored under the flexible display panel, when the flexible display panel is rolled up; wherein the supporting members are leaned to a backside surface of the flexible display panel, when the flexible display panel is unrolled.

In some embodiments, there is provided a mobile terminal, the mobile terminal includes a flexible display device and the flexible display device includes a flexible display panel including a first side and a second side, wherein the first side is opposite to the second side; a roll-up mechanism including a master shaft for rolling up and unrolling the flexible display panel, wherein the first side of the flexible display panel is fixed to the master shaft; a support mechanism including a plurality of supporting members, wherein the supporting members are articulated each other; wherein the supporting members are stored under the flexible display panel, when the flexible display panel is rolled up; wherein the supporting members are clung to a backside surface of the flexible display panel, when the flexible display panel is unrolled.

It should be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure. Obviously, the accompanying drawings in the following only illustrate some embodiments of the present disclosure. By reference to these accompanying drawings, other drawings will be obtained, by those of ordinary skill in the art, without any creative effort.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

As shown in FIG. 1 to FIG. 9, the flexible display device, in some embodiments of the present disclosure, includes the followings.

A flexible display panel 1 includes a first side and a second side, and the first side is opposite to the second side.

Figure 2:
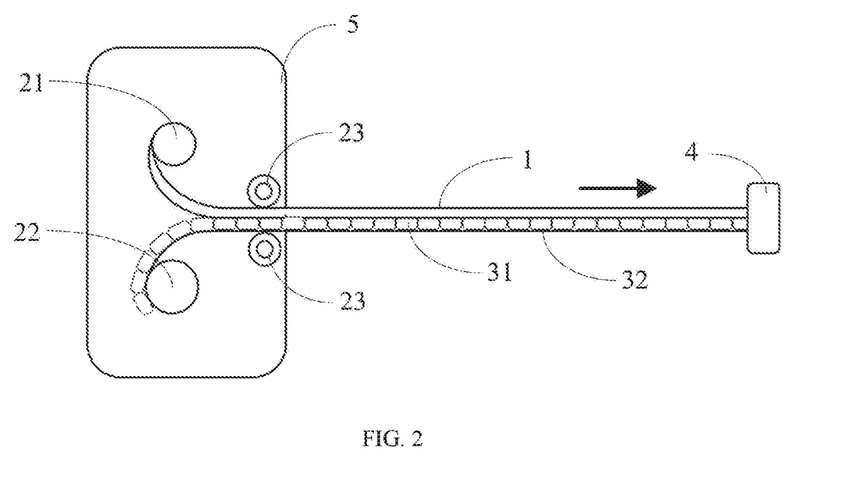
FIG. 2 is a schematic view of an unrolled state of the flexible display device of FIG. 1.
Figure 6:
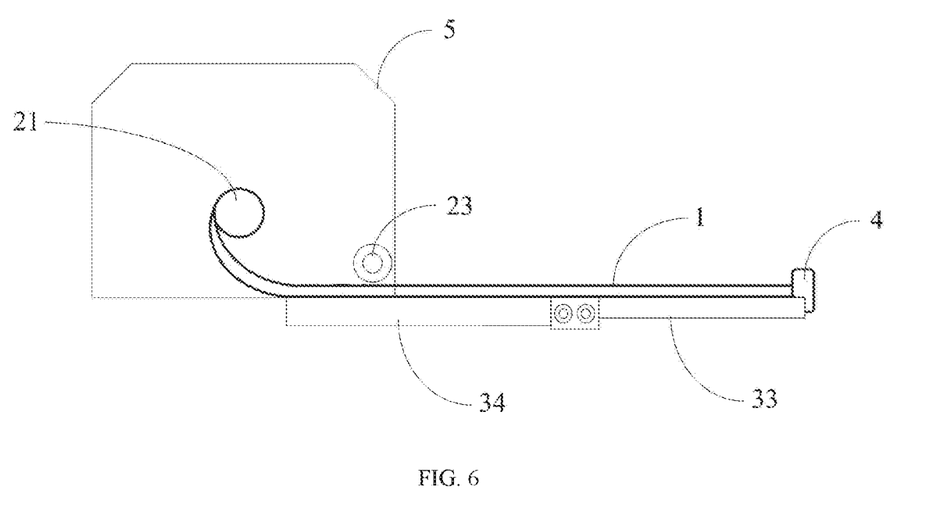
FIG. 6 is a schematic view of an unrolled state of the flexible display device of FIG. 3.
Figure 9:
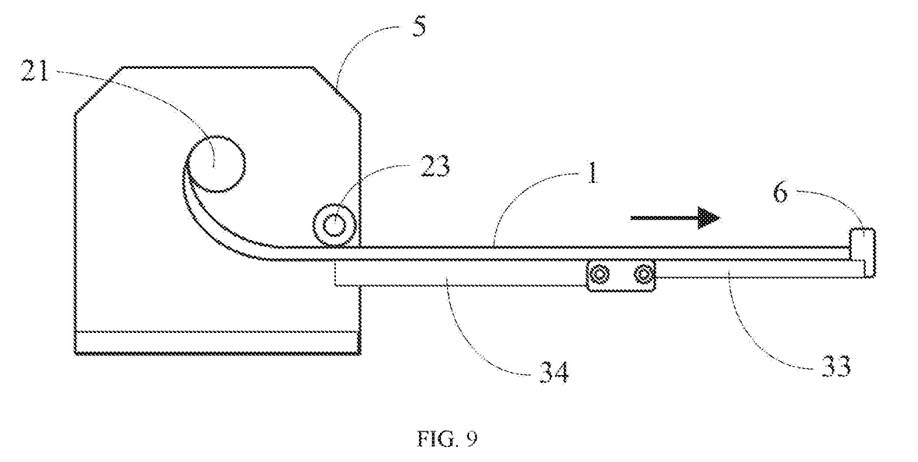
FIG. 9 is a schematic view of an unrolled state of the flexible display device of FIG. 7.

A roll-up mechanism includes a master shaft 21 for rolling up and unrolling the flexible display panel 1, and the first side of the flexible display panel 1 is fixed to the master shaft 21. As shown in FIG. 2, FIG. 6 and FIG. 9, the first side, i.e. a left side of the figures, of the flexible display panel 1 is fixed to the master shaft 21. A body of the flexible display panel 1 and the second side, i.e. a right side of the figures, of the flexible display panel 1 are rolled up onto the master shaft 21 or unrolled.

A support mechanism includes a plurality of supporting members, and the supporting members are articulated each other. For example, supporting members 31, as shown in FIG. 1 and FIG. 2, and supporting members 33 and 34.

Figure 1:
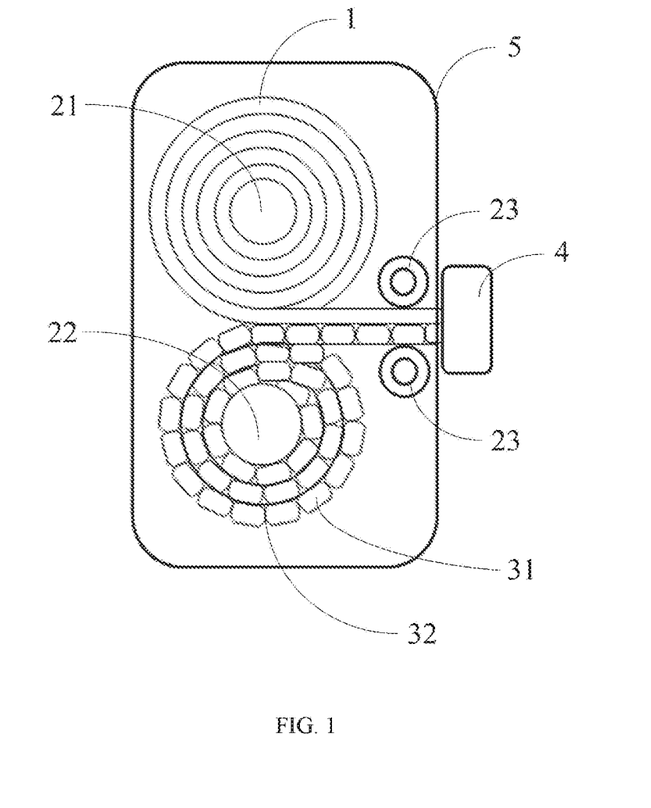
FIG. 1 is a schematic view of a rolled-up state of a flexible display device in one embodiment of the present disclosure.
Figure 3:
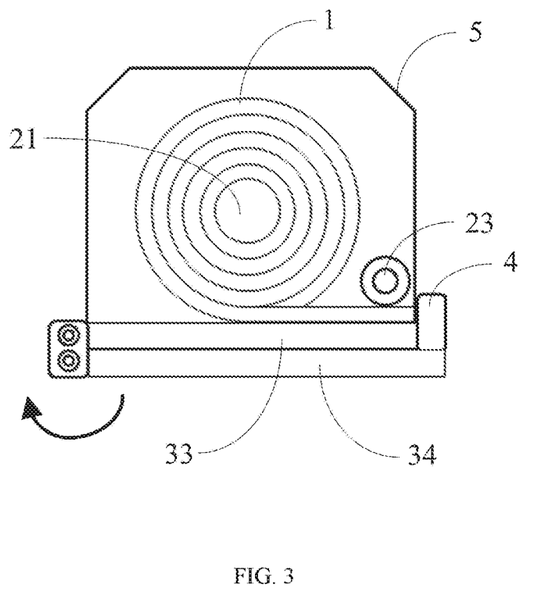
FIG. 3 is a schematic view of a rolled-up state of another flexible display device in one embodiment of the present disclosure.
Figure 7:
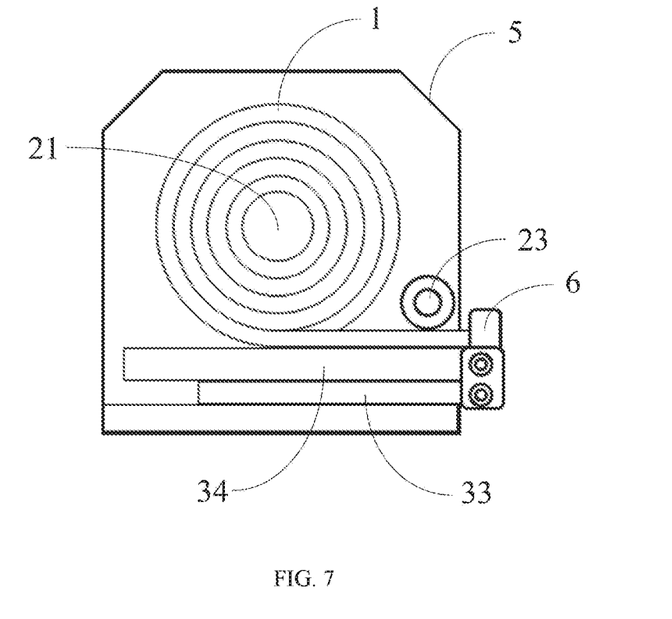
FIG. 7 is a schematic view of a rolled-up state of another flexible display device in some embodiments of the present disclosure.

As shown in FIG. 1, FIG. 3 and FIG. 7, the supporting members are stored under the flexible display panel 1 when the flexible display panel 1 is rolled up. Therefore, the size of the flexible display device is reduced at the storage state. As shown in FIG. 2, FIG. 6 and FIG. 9, the supporting members are leaned to a backside surface of the flexible display panel 1 when the flexible display panel 1 is unrolled. The supporting members are used to support the flexible display panel 1 and keep the flexible display panel 1 flat when the flexible display panel 1 is used by a user.

As shown in FIG. 1 and FIG. 2, in some embodiments, the supporting members of the support mechanism are articulated each other to form an articulated supporting member 31. The roll-up mechanism further includes a rolling shaft 22 for rolling up and unrolling the articulated supporting member 31, wherein a first end of the articulated supporting member 31 is fixed to the rolling shaft 22 and a second end of the articulated supporting member 31 is fixed to the second side of the flexible display panel 1. As shown in the figures, for example, a left end of the articulated supporting member 31 is fixed to the rolling shaft 22 and a right end of the articulated supporting member 31 is fixed to the second side of the flexible display panel 1. The right end of the articulated supporting member 31 is fixed, by a connecting member 4, to the second side of the flexible display panel 1. The articulated supporting member 31 will be rolled up when the flexible display panel 1 is rolled up. The articulated supporting member 31 will be unrolled when the flexible display panel 1 is unrolled.

In some embodiments, the flexible display panel 1 and the articulated supporting member 31 will be simultaneously unrolled by pulling the connecting member 4, e.g. pulling the connecting member 4 along the arrow shown in FIG. 2, when the flexible display device is in the storage state shown in FIG. 1. Every two adjacent supporting members of the articulated supporting member 31 are meshed each other for keeping the articulated supporting member 31 flat and avoids loose, when the flexible display panel 1 is unrolled. After the flexible display panel 1 is unrolled, the articulated supporting member 31 is leaned to the backside surface of the flexible display panel 1 to support the flexible display panel 1. The flexible display device returns to the storage state, as shown in FIG. 1, by applying reverse operation, when the flexible display device needs to be rolled up after using.

In some embodiments, the support mechanism further includes a supporting plate 32, wherein a first surface, i.e. the upper surface in the drawings, of the articulated supporting member 31 is leaned to the backside surface of the flexible display panel 1, and the supporting plate 32 is leaned to a second surface, i.e. the lower surface in the drawings, opposite to the first surface, of the articulated supporting member 31. The supporting plate 32, leaned to the backside surface of the articulated supporting member 31, ensures that the support mechanism keeps flat and avoids loose during unrolling, and supports the flexible display panel 1.

In some embodiments, the flexible display device further includes a housing 5 for receiving the roll-up mechanism and the support mechanism. The flexible display panel 1 is received in the housing 5 when the flexible display panel 1 is rolled up. A side wall of the housing 5 includes an opening which allows the roll-up mechanism and the support mechanism to pass through. The roll-up mechanism further includes two slave shafts 23, respectively disposed on each of two sides of the opening, i.e. respectively disposed above and below the opening. The two slave shafts 23 guide the flexible display panel 1 and the support mechanism between the two slave shafts 23 when rolling up and unrolling the flexible display panel 1 and the support mechanism. That is, rolling-up movements and unrolling movements of the flexible display panel 1 and the support mechanism are proceeded between the two slave shafts 23.

In some embodiments, the flexible display panel 1, the articulated supporting member 31 and the supporting plate 32 fixed to the articulated supporting member 31 are simultaneously unrolled by pulling the connecting member 4, when the flexible display device is in the storage state shown in FIG. 1. Unrolling movements of the flexible display panel 1, the articulated supporting member 31 and the supporting plate 32 are proceeded between the two slave shafts 23, which ensures that the flexible display panel 1, the articulated supporting member 31 and the supporting plate 32 are leaned to each other. The slave shafts 23 are rolled in response to the rolling of the master shaft 21 and the rolling shaft 22, the unrolling of the flexible display panel 1 and the unrolling of the articulated supporting member 31 and the supporting plate 32 are leaded by the the rolling of the slave shafts 23.

In some embodiments, the surface of the articulated supporting member 31 includes adsorbing micro-pores filled with the nanometer electrostatic adsorbing material. Therefore, the flexible display panel 1 will be adsorbed onto the surface of the articulated supporting member 31 to avoid warp when the flexible display panel 1 is unrolled.

In some embodiments, there is further provided a mobile terminal including the flexible display device described in the above embodiments.

Referring to FIG. 3 to FIG. 6, in some embodiments, the support mechanism includes a first supporting member 33 and a second supporting member 34 which are articulated each other. The flexible display device further includes a housing 5 for receiving the roll-up mechanism, and the flexible display panel 1 is received in the housing 5 when the flexible display device is rolled up. The surface of the support mechanism includes a guiding groove, and a bottom of the housing 5 is sliding inlaid in the guiding groove. The flexible display panel 1 is rolled up and unrolled in response to sliding movements, proceeded in the guiding groove, of the housing 5.

In some embodiments, the second supporting member 34, stacked with the first supporting member 33, is turned, by turning over the second supporting member 34 along the toward direction of the arrow shown in FIG. 3, to align with the first supporting member 33, when the flexible display device is in the storage state shown in FIG. 3. The flexible display panel 1, rolled up on the master shaft 21, is unrolled to an extended state shown in FIG. 6, by driving, along the toward direction of the arrow shown in FIG. 5, the housing 5 to slide on a surface formed by the first supporting member 33 and the second supporting member 34, and the master shaft 21 is further driven to roll. The flexible display device returns to the storage state, as shown in FIG. 3, by applying reverse operations, when the flexible display device needs to be rolled up after using.

Figure 4:
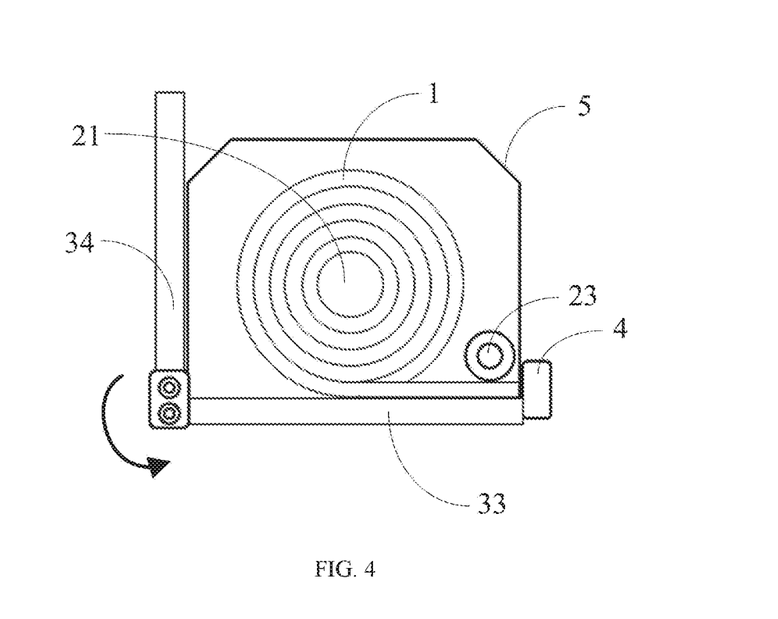
FIG. 4 is a schematic view of another rolled-up state of the flexible display device of FIG. 3.
Figure 5:
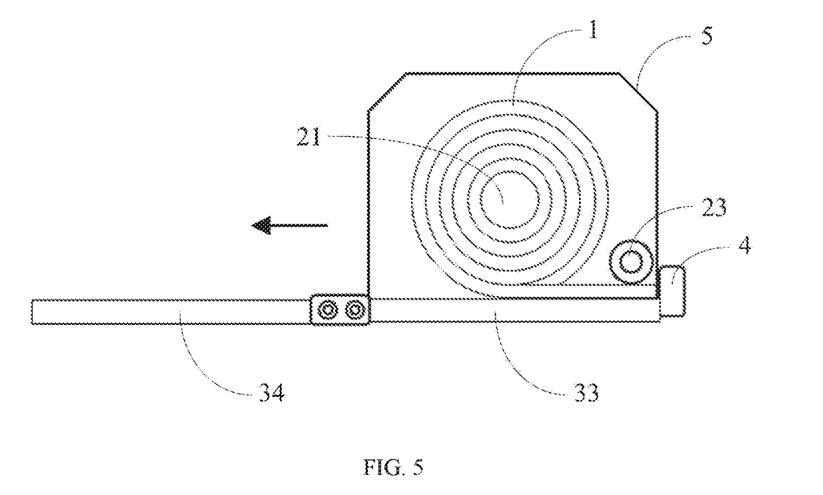
FIG. 5 is a schematic view of an unrolling process of the flexible display device of FIG. 3.

In some embodiments, the second supporting member 34, leaned to the housing 5, is turned to align with the first supporting member 33, by turning over the second supporting member 34 along the toward direction of the arrow shown in FIG. 4, when the flexible display device is in the storage state shown in FIG. 4. The flexible display panel 1, rolled up on the master shaft 21, is unrolled to an extended state shown in FIG. 6, by driving, along the toward direction of the arrow shown in FIG. 5, the housing 5 to slide on a surface formed by the first supporting member 33 and the second supporting member 34, and the master shaft 21 is further driven to roll. The flexible display device returns to the storage state shown in FIG. 4 by applying reverse operations, when the flexible display device needs to be rolled up after using.

The support mechanism is disposed outside the housing 5. Therefore, the first supporting member 33 and the second supporting member 34 are stacked and rolled up under the flexible display panel 1, or are respectively leaned to the side wall of the housing 5 to protect the housing 5, at the storage state.

In some embodiments, the second side of the flexible display panel 1 is fixed to the right end of the first supporting member 33 by the connecting member 4, and the sum of the lengths of the first supporting member 33 and the second supporting member 34 is equal to or greater than distance of the first side and the second side of the flexible display panel 1. Therefore, the flexible display panel 1 is able to be completely unrolled. In some embodiments, the length of each of the first supporting member 33 and the second supporting member 34 is less than or equal to the length of corresponding side wall of the housing 5, to reduce the size of the flexible display device in the storage state.

In some embodiments, the side wall of the housing 5 includes an opening which allows the flexible display panel 1 to pass through, and the roll-up mechanism further includes a slave shaft 23, disposed on a side of the opening of the housing 5. The slave shaft 23 guide the flexible display panel 1 between the slave shaft 23 and the support mechanism when rolling up and unrolling the flexible display panel 1. The second supporting member 34 can be turned aligned the first supporting member 33 when the flexible display device is in the storage state shown in FIG. 3, and the flexible display panel 1 will be unrolled, by pulling the housing 5 to drive the master shaft 21 to roll. During the unrolling process, the flexible display panel 1 is leaned, by the slave shaft 23, to the surface of the first supporting member 33 and the second supporting member 34. The second side of the flexible display panel 1 is fixed to the right end of the first supporting member 33 by the connecting member 4 to avoid the looseness of flexible display panel 1 during the unrolling process. The slave shaft 23 is rolled in response to the rolling of the master shaft 21 and the unrolling of the flexible display panel 1 is leaded by the the rolling of the slave shaft 23.

In some embodiments, the surface of the first supporting member 33 and the second supporting member 34 includes adsorbing micro-pores filled with the nanometer electrostatic adsorbing material. Therefore, the flexible display panel 1 will be adsorbed onto the surfaces of the first supporting member 33 and the second supporting member 34 when the flexible display panel 1 is unrolled, and the flexible display panel 1 will not warp.

In some embodiments, there is further provided a mobile terminal including the flexible display device described in the above embodiments.

Figure 8:
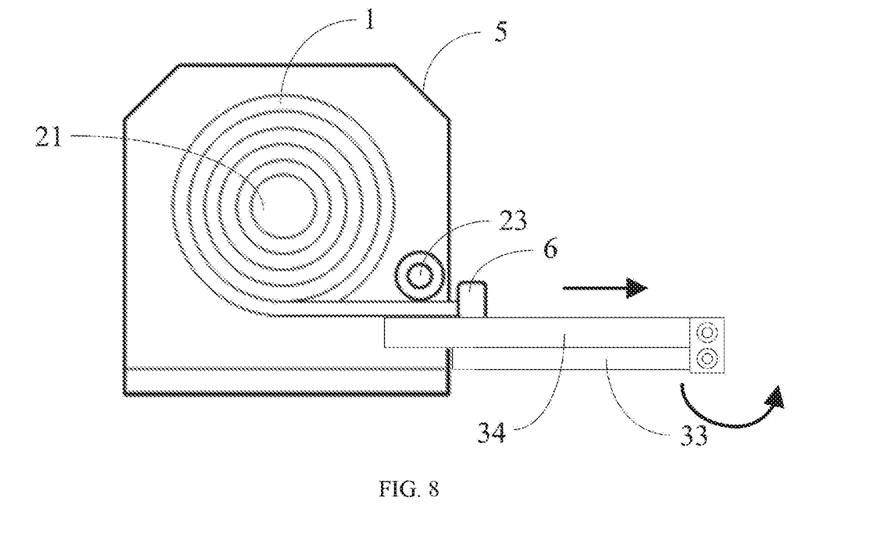
FIG. 8 is a schematic view of an unrolling process of the flexible display device of FIG. 7.

Referring to FIG. 7 to FIG. 9, in some embodiments, the support mechanism includes a first supporting member 33 and a second supporting member 34 articulated each other. The surface of the first supporting member 33 and the second supporting member 34 includes a guiding groove (not shown), and a guiding wheel 6 is disposed at the second side of the flexible display panel 1. The guiding wheel 6 is sliding inlaid in the guiding groove. The flexible display panel 1 is rolling up and unrolling in response to sliding movements, in the guiding groove, of the guiding wheel 6.

In some embodiments, the flexible display device further includes a housing 5 for receiving the roll-up mechanism and the support mechanism, and a side wall of the housing 5 includes an opening which allows the flexible display panel 1, the first supporting member 33 and the second supporting member 34 to pass through. The roll-up mechanism further includes a slave shaft 23, disposed on a side of the opening to guide the flexible display panel 1 between the slave shaft 23 and the support mechanism when rolling up and unrolling the flexible display panel 1.

In some embodiments, when the flexible display device is at the storage state, as shown in FIG. 7, the flexible display panel 1 is rolled up on the master shaft 21 and the first supporting member 33 and the second supporting member 34 are stacked and stored under the flexible display panel 1. The flexible display panel 1, the roll-up mechanism and the support mechanism are all received in the housing 5. Therefore, the size of the flexible display device is reduced such that the flexible display device is easy to carry. The first supporting member 33 and the second supporting member 34 are pulled out of the housing 5 along the right-arrow shown in FIG. 8. The first supporting member 33 is turned over, along the curved arrow shown in FIG. 8, after the first supporting member 33 is completely pulled out of the housing 5. The turned-over first supporting member 33 is meshed and aligned with the second supporting member 34. The flexible display panel 1 is then unrolled along the first supporting member 33 and the second supporting member 34, by driving the guiding wheel 6 along the arrow shown in FIG. 9 to slide in the guiding groove. During the unrolling process, the flexible display panel 1 is leaned, by the slave shaft 23, to the surface of the first supporting member 33 and the second supporting member 34, when the flexible display panel 1 is unrolled. The flexible display device will return to the storage state shown in FIG. 7 by applying reverse operations, when the flexible display device needs to be stored after using.

In some embodiments, the surface of the first supporting member 33 and the second supporting member 34 include adsorbing micro-pores filled with the nanometer electrostatic adsorbing material. Therefore, the flexible display panel 1 will be adsorbed onto the surfaces of the first supporting member 33 and the second supporting member 34 and will not warp, when the flexible display panel 1 is unrolled.

In some embodiments, there is further provided a mobile terminal including the flexible display device described in the above embodiments.

The advantages of the present disclosure include the followings.

The support mechanism of the present disclosure includes a plurality of supporting members articulated each other. The supporting members are stored under the flexible display panel when the flexible display panel is rolled up, to reduce the size of the flexible display device. Moreover, the supporting members support the flexible display panel when the flexible display panel is unrolled, to keep the flexible display panel flat and stable.

The above description includes part of embodiments of the present disclosure, and not limits the present disclosure. Any modifications, equivalent substitutions, improvements, etc., within the spirit and principles of the present disclosure, are included in the scope of protection of the present disclosure.

What is claimed is:
1. A flexible display device comprising:
a flexible display panel comprising a first side and a second side, wherein the first side is opposite to the second side;
a roll-up mechanism comprising a master shaft for rolling up and unrolling the flexible display panel, wherein the first side of the flexible display panel is fixed to the master shaft;

a support mechanism comprising a plurality of supporting members, wherein the supporting members are articulated each other;

a housing for receiving the roll-up mechanism;

wherein the supporting members are stored under the flexible display panel, when the flexible display panel is rolled up;

wherein the supporting members are leaned to a backside surface of the flexible display panel, when the flexible display panel is unrolled;

wherein a surface of the support mechanism comprises a guiding groove, and a bottom of the housing is sliding inlaid in the guiding groove, wherein the flexible display panel is rolling up and unrolling in response to sliding movements, in the guiding groove, of the housing.

2. The flexible display device of claim 1, wherein a side wall of the housing comprises an opening which allows the flexible display panel to pass through, and the roll-up mechanism further comprises:

a slave shaft, disposed on a side of the opening to guide the flexible display panel between the slave shaft and the support mechanism when rolling up and unrolling the flexible display panel.

3. A flexible display device, comprising:

a flexible display panel comprising a first side and a second side, wherein the first side is opposite to the second side;

a roll-up mechanism comprising a master shaft for rolling up and unrolling the flexible display panel, wherein the first side of the flexible display panel is fixed to the master shaft;

a support mechanism comprising a plurality of supporting members, wherein the supporting members are articulated each other;

wherein the supporting members are stored under the flexible display panel, when the flexible display panel is rolled up;

wherein the supporting members are leaned to a backside surface of the flexible display panel, when the flexible display panel is unrolled;

wherein a surface of the support mechanism comprises a guiding groove, and a guiding wheel is disposed at the second side of the flexible display panel, the guiding wheel is sliding inlaid in the guiding groove;

wherein the flexible display panel is rolling up and unrolling in response to sliding movements, in the guiding groove, of the guiding wheel.

4. The flexible display device of claim 3, further comprising a housing for receiving the roll-up mechanism and the support mechanism, wherein a side wall of the housing comprises an opening which allows the flexible display panel and the support mechanism to pass through;

wherein the roll-up mechanism further comprises a slave shaft, disposed on a side of the opening to guide the flexible display panel between the slave shaft and the support mechanism when rolling up and unrolling the flexible display panel.

5. The flexible display device of claim 1, wherein a surface of the support mechanism comprises adsorbing micro-pores.

6. A mobile terminal comprising a flexible display device, wherein the flexible display device comprises:

a flexible display panel comprising a first side and a second side, wherein the first side is opposite to the second side;

a roll-up mechanism comprising a master shaft for rolling up and unrolling the flexible display panel, wherein the first side of the flexible display panel is fixed to the master shaft;

a support mechanism comprising a plurality of supporting members, wherein the supporting members are articulated each other, a housing for receiving the roll-up mechanism;

wherein the supporting members are stored under the flexible display panel, when the flexible display panel is rolled up;

wherein the supporting members are leaned to a backside surface of the flexible display panel, when the flexible display panel is unrolled;

wherein a surface of the support mechanism comprises a guiding groove, and a bottom of the housing is sliding inlaid in the guiding groove, wherein the flexible display panel is rolling up and unrolling in response to sliding movements, in the guiding groove, of the housing.

7. The flexible display device of claim 1, wherein the support mechanism comprises a first supporting member and a second supporting member;

when the flexible display device is in the storage state, the second supporting member is stacked with the first supporting member.

8. The flexible display device of claim 3, wherein the support mechanism comprises a first supporting member and a second supporting member;

when the flexible display device is in the storage state, the second supporting member is stacked with the first supporting member.

9. The flexible display device of claim 3, wherein a surface of the support mechanism comprises adsorbing micro pores.

10. A mobile terminal comprising a flexible display device, wherein the flexible display device comprises:

a flexible display panel comprising a first side and a second side, wherein the first side is opposite to the second side;

a roll-up mechanism comprising a master shaft tor rolling up and unrolling the flexible display panel, wherein the first side oi the flexible display panel is fixed to the master shaft;

a support mechanism comprising a plurality of supporting members, wherein the supporting members are articulated each other;

wherein the supporting members are stored under the flexible display panel, when the flexible display panel is rolled up;

wherein the supporting members are leaned to a backside surface of the flexible display panel, when the flexible display panel is unrolled;

wherein a surface of the support mechanism comprises a guiding groove, and a guiding wheel is disposed at the second side of the flexible display panel, the guiding wheel is sliding inlaid in the guiding groove;

wherein the flexible display panel is rolling up and unrolling in response to sliding movements, in the guiding groove, of the guiding wheel.

* * * * *